United States Patent
Summerfield

(10) Patent No.: US 7,741,906 B1
(45) Date of Patent: Jun. 22, 2010

(54) METHOD OF AND CIRCUIT FOR GENERATING PARAMETERS FOR A PREDISTORTION CIRCUIT IN AN INTEGRATED CIRCUIT

(75) Inventor: Stephen Summerfield, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/201,642

(22) Filed: Aug. 29, 2008

(51) Int. Cl.
  *H03F 1/26* (2006.01)
(52) U.S. Cl. ...................................... 330/149
(58) Field of Classification Search ................. 330/149; 375/296, 297; 455/114.3
  See application file for complete search history.

(56) References Cited

U.S. PATENT DOCUMENTS

| | | | |
|---|---|---|---|
| 5,867,065 A | | 2/1999 | Leyendecker |
| 6,794,936 B2* | | 9/2004 | Hsu et al. ................. 330/149 |
| 6,798,843 B1 | | 9/2004 | Wright et al. |
| 6,998,909 B1 | | 2/2006 | Mauer |
| 7,151,405 B2 | | 12/2006 | Nezami |
| 7,269,231 B2 | | 9/2007 | Ding et al. |
| 7,348,844 B2* | | 3/2008 | Jaenecke ................. 330/149 |
| 2003/0063686 A1* | | 4/2003 | Giardina et al. ............ 375/296 |
| 2008/0157819 A1 | | 7/2008 | Bhandari et al. |
| 2008/0157869 A1 | | 7/2008 | Bhandari et al. |
| 2008/0157870 A1 | | 7/2008 | Bhandari et al. |

OTHER PUBLICATIONS

U.S. Appl. No. 12/201,633, filed Aug. 29, 2008, Summerfield.
U.S. Appl. No. 12/201,702, filed Aug. 29, 2008, Summerfield et al.
U.S. Appl. No. 12/201,706, filed Aug. 29, 2008, Summerfield.
U.S. Appl. No. 12/201,718, filed Aug. 29, 2008, Barnes et al.
Altera Corporation, "Digital Predistortion Reference Design," copyright 1995-2008, pp. 1-2, available at URL: http://www.altera.com/support/refdesigns/sys-sol/wireless/ref-dig-predis.html or from Altera Corporation, 101 Innovation Drive, San Jose, California 95134.
Altera Corporation, "Digital Predistortion," copyright 1995-2008, pp. 1-4, available at URL: http://www.altera.com/end-markets/wireless/advanced-dsp/predistortion/wir-digital-predistortion.html or from Altera Corporation, 101 Innovation Drive, San Jose, California 95134.

(Continued)

*Primary Examiner*—Khanh V Nguyen
(74) *Attorney, Agent, or Firm*—John J. King

(57) ABSTRACT

A method of generating parameters for a predistortion circuit in an integrated circuit is disclosed. The method comprises receiving, at the predistortion circuit, an input signal to be amplified by a power amplifier; receiving an output of the power amplifier at an input of the integrated circuit; comparing an output of the predistortion circuit with the output of the power amplifier; conforming the output of the power amplifier with the output of the predistortion circuit; and generating parameters to be applied to the predistortion circuit based upon the conformed output of the power amplifier and the predistortion circuit. An integrated circuit having a circuit for generating parameters for a predistortion circuit of the integrated circuit is also disclosed.

14 Claims, 11 Drawing Sheets

OTHER PUBLICATIONS

Altera Corporation, "Digital Predistortion Reference Design," Application Note AN-314-1.0, Jul. 2003, pp. 1-46, available from Altera Corporation, 101 Innovation Drive, San Jose, California 95134.

Ding, Lei et al., "A Hammerstein Predistortion Linearization Design Based on the Indirect Learning Architecture," *Proc. of the 2002 IEEE International Conference on Acoustics, Speech & Signal Processing*, May 13, 2002, pp. III-2689-III-2692, vol. 3, IEEE., Piscataway, New Jersey, USA.

Gilabert, Pere L. et al., "Multi-Lookup Table FPGA Implementation of an Adaptive Digital Predistorter for Linearizing RF Power Amplifiers With Memory Effects," *IEEE Transactions on Microwave Theory and Techniques*, Feb. 1, 2008, pp. 372-384, vol. 56, No. 2, IEEE, Piscataway, New Jersey, USA.

Kwan, Andrew et al., "Automating the Verification of SDR Baseband Signal Processing Algorithms Developed on DSP/FPGA Platform," *Proc. of the 2006 IEEE Workshop on Signal Processing Systems Design and Implementation*, Oct. 1, 2006, pp. 5-9, IEEE, Piscataway, New Jersey, USA.

\* cited by examiner

METHOD OF AND CIRCUIT FOR GENERATING PARAMETERS FOR A PREDISTORTION CIRCUIT IN AN INTEGRATED CIRCUIT

FIELD OF THE INVENTION

The present invention relates generally to integrated circuits, and in particular, to a method of and circuit for generating parameters for a predistortion circuit in an integrated circuit.

BACKGROUND OF THE INVENTION

Integrated circuits are an integral part of any electronic device. A variety of integrated circuits are often used together to enable the operation of the electronic device. While integrated circuits are typically designed for a particular application, certain integrated circuits may have configurable logic. For example, an application specific integrated circuit (ASIC) may have portions comprising configurable logic. Another type of integrated circuit which has configurable logic is a programmable logic device (PLD). A programmable logic device is designed to be user-programmable so that users may implement logic designs of their choices. One type of programmable logic device is a Complex Programmable Logic Device (CPLD). A CPLD includes two or more "function blocks" having a two-level AND/OR structure connected together and to input/output (I/O) resources by an interconnect switch matrix. Another type of programmable logic device is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. For both of these types of programmable logic devices, the functionality of the device is controlled by configuration data bits of a configuration bitstream provided to the device for that purpose.

Integrated circuits may be used in arrangements for transmitting data. Because data transmitted using a power amplifier (PA) may be distorted, a predistortion circuit may be employed. The purpose of predistortion is to negate the non-linear effects of a power amplifier. Predistortion is achieved by applying a non-linear filter to the signal prior to transmission. The predistortion circuit acts on the transmitted data to cancel the distortion in the PA by implementing an inverse model of the amplifier. The predistortion circuit may be a function having a vector of parameters applied to the sequence of transmitted data. However, implementing a predistortion circuit in a device having programmable logic poses a number of problems.

SUMMARY OF THE INVENTION

A method of generating parameters for a predistortion circuit in an integrated circuit is disclosed. The method comprises receiving, at the predistortion circuit, an input signal to be amplified by a power amplifier; receiving an output of the power amplifier at an input of the integrated circuit; comparing an output of the predistortion circuit with the output of the power amplifier; conforming the output of the power amplifier with the output of the predistortion circuit; and generating parameters to be applied to the predistortion circuit based upon the conformed output of the power amplifier and the predistortion circuit. Conforming the output of the power amplifier with the output of the predistortion circuit may comprise adjusting the amplitude of the input signal received at the predistortion circuit or the output of the power amplifier to make the amplitude of the output of the predistortion circuit and the output of the power amplifier equal, eliminating any delay between the output of the predistortion circuit and the output of the power amplifier, and eliminating a frequency offset between the output of the predistortion circuit and the output of the power amplifier. Eliminating a frequency offset may comprise determining a phase difference between the output of the predistortion circuit and the output of the power amplifier and generating an approximation of the phase difference, wherein generating an approximation of the phase difference may comprise converting a trigonometric representation of the phase difference to an algebraic representation of the phase difference.

According to an alternate embodiment, the method of generating parameters for a predistortion circuit in an integrated circuit comprises receiving, at the predistortion circuit, an input signal to be amplified by a power amplifier; receiving an output of the power amplifier at an input of the integrated circuit; comparing an output of the predistortion circuit with the output of the power amplifier; determining a phase difference between the output of the predistortion circuit and the output of the power amplifier; generating an approximation of the phase difference; conforming the output of the power amplifier with the output of the predistortion circuit based upon the approximation of the phase difference; and generating parameters to be applied to the predistortion circuit based upon conformed outputs of the power amplifier and the predistortion circuit.

An integrated circuit having a circuit for generating parameters for a predistortion circuit of the integrated circuit is also disclosed. The circuit for adapting parameters comprises a predistortion circuit coupled to receive an input signal to be amplified by a power amplifier coupled to the integrated circuit; a signal correction circuit coupled to receive an output of the predistortion circuit and an output of the power amplifier, the signal correction circuit conforming the output of the power amplifier with the output of the predistortion circuit; and an estimation circuit coupled to receive the output of the signal correction circuit, the estimation circuit generating parameters for the predistortion circuit based upon the conformed outputs of the power amplifier and the predistortion circuit. The signal correction circuit of the integrated circuit may comprise an amplitude alignment circuit, a delay alignment circuit, and a frequency offset correction circuit.

DETAILED DESCRIPTION

Figure 1:
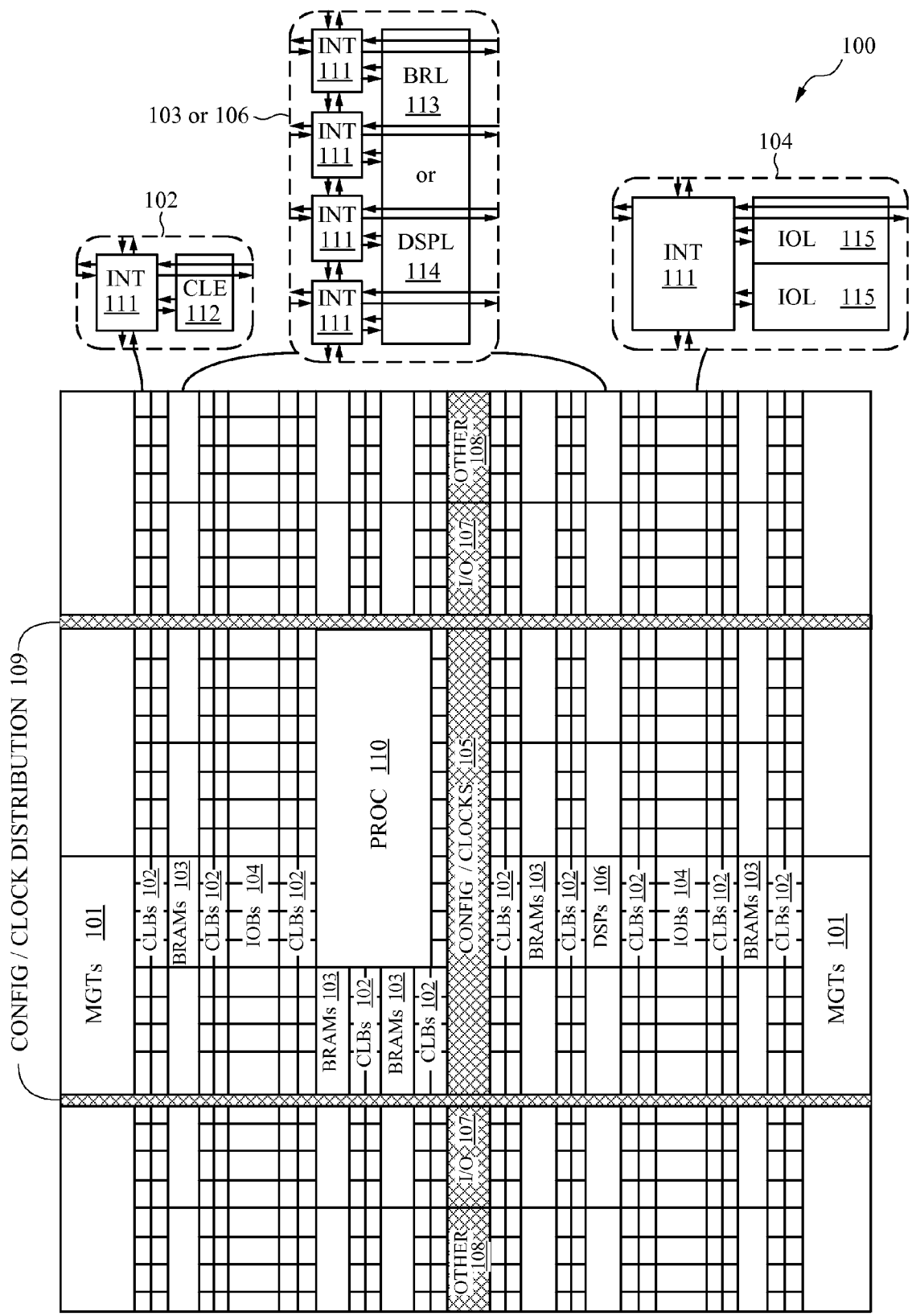
FIG. 1 is a block diagram of a device having configurable logic according to an embodiment the present invention.

Turning first to FIG. 1, a block diagram of a device having configurable logic according to an embodiment the present invention is shown. The device of FIG. 1 comprises an FPGA architecture 100 having a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 may include a configurable logic element (CLE 112) that may be programmed to implement user logic plus a single programmable interconnect element (INT 111). A BRAM 103 may include a BRAM logic element (BRL 113) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 106 may include a DSP logic element (DSPL 114) in addition to an appropriate number of programmable interconnect elements. An IOB 104 may include, for example, two instances of an input/output logic element (IOL 115) in addition to one instance of the programmable interconnect element (INT 111). The location of connections of the device is controlled by configuration data bits of a configuration bitstream provided to the device for that purpose. As will be described in more detail below, the programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic. The circuits and methods of the present invention may be implemented in the PLD of FIG. 1, or in any other suitable device, including any type of integrated circuit having programmable logic.

Figure 2:
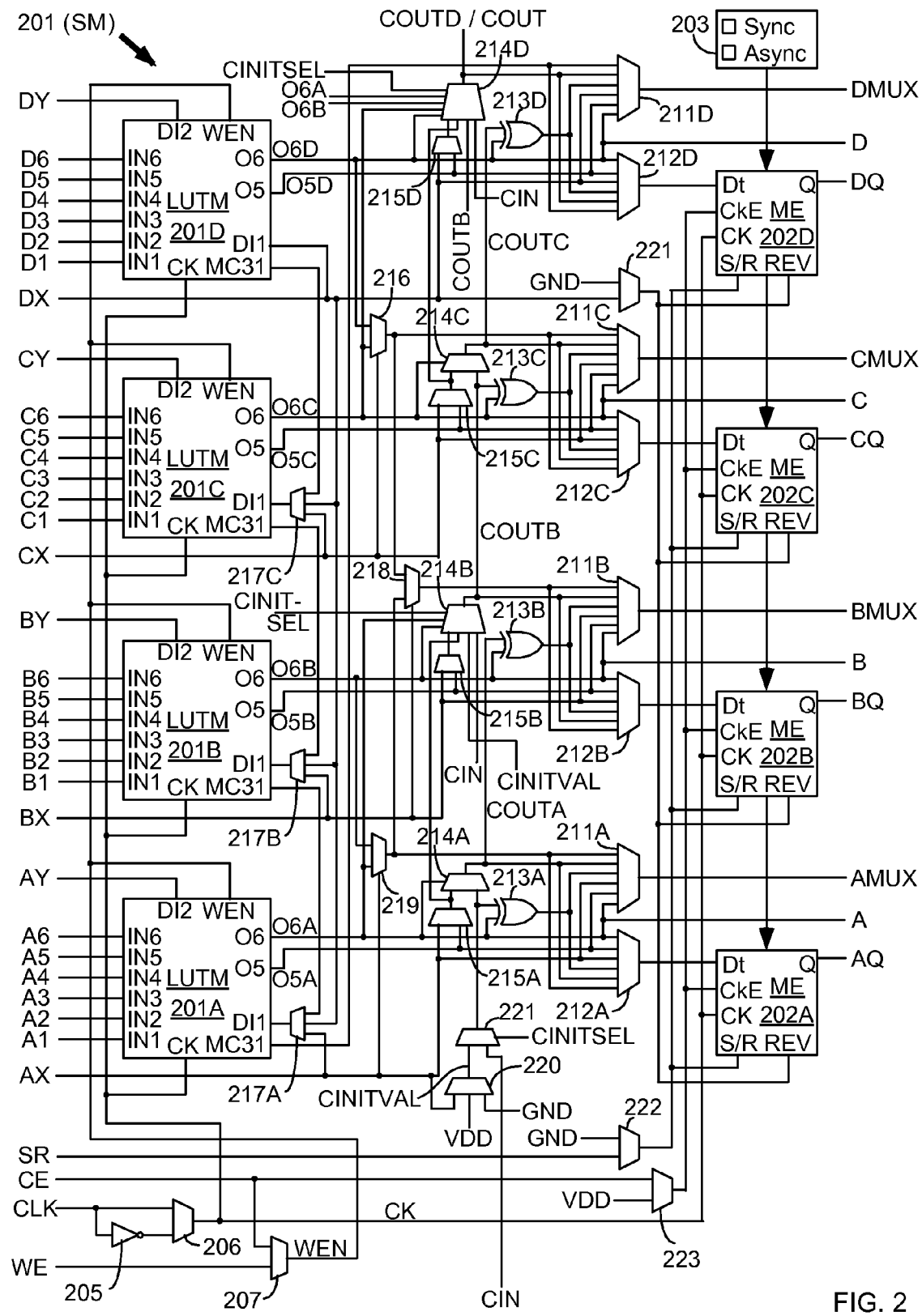
FIG. 2 is a block diagram of a configurable logic element of the device of FIG. 1 according to an embodiment of the present invention.

Turning now to FIG. 2, a block diagram of a configurable logic element of the device of FIG. 1 according to an embodiment of the present invention is shown. In particular, FIG. 2 illustrates in simplified form a configurable logic element of a configuration logic block 102 of FIG. 1. The configurable logic element shown comprises two similar slices, where each slice comprises a pair of function generators. However, the configurable logic element may comprise more slices, such as four slices, for example. Each function generator may function in any of several modes depending upon the configuration data in the configuration memory elements M1-M14. When in RAM mode, input data is supplied by input terminals DI_1 and DI_2 to the data input (DI) terminal of the associated function generator. Each function generator, which may comprise a lookup table, provides an output signal to an associated multiplexer, which selects between the output signal of the function generator and an associated register direct input signal Reg_DI_1 or Reg_DI_2 from the programmable interconnect element. Thus, each function generator may be optionally bypassed. When in a look-up table mode, each function generator implemented as a look-up table has four data input signals IN0-IN3. Slice 1 comprises a function generator implemented as a LUT 202 coupled to a multiplexer 204. In particular, the LUT 202 receives 4 input signals which are decoded to generate an output D1 associated with data stored in the LUT at the address designated by the input signals. The multiplexer 204 is adapted to receive the output of LUT 202 and a registered value of Reg_DI_1. The output of the multiplexer 204 is coupled to a register 206 which generates an output Q1.

A Write Control Circuit 208 is coupled to receive RAM control signals and generate signals to control the LUT 202. In addition to a data input (DI) coupled to receive DI_1 and conventional read and write control signals coupled to a read enable input (R) and a write enable input (W), respectively, the LUT 202 comprises a partial reset input (RST) for receiving a partial reset signal, and an initial state input (IS) for receiving an initial state signal. Such resetting of the memory elements enables resetting the LUT memory cells during a partial reconfiguration of a programmable logic device, including partial reconfiguration of a device during operation. One advantage of resetting LUT memory elements of a device during partial reconfiguration is that it is not necessary to cycle through the required clock cycles to set the correct data after the partial reconfiguration. Similarly, slice 1 comprises a function generator implemented as a LUT 210 coupled to a multiplexer 212. The LUT 210 is adapted to receive input signals IN4-IN7, while the multiplexer 212 is coupled to receive the output D2 of the LUT 210 and the registered input value Reg_DI_2. The output of the multiplexer 212 is coupled to a register 214 which generates an output Q2. The write control circuit 208 also generates a partial reset signal and an initial state signal for selectively resetting or setting one or more of the bits of the LUT 210.

Similarly, slice 2 comprises a function generator implemented as a LUT 222 coupled to a multiplexer 224. The LUT 222 is adapted to receive input signals IN8-IN11, while the multiplexer 224 is coupled to receive the output of the LUT 222 and a registered input value Reg_DI_3. The output of the multiplexer 224 is coupled to a register 226 which generates an output Q3. A Write Control Circuit 228 is coupled to receive RAM control signals and generate signals to control the LUT 222. In particular, input signals IN8-IN11 are decoded to generate an output D3 associated with data stored in the LUT at the address designated by the input signals. The LUT 222 comprises a partial reset input (RST) for receiving a partial reset signal, and an initial state input (IS) for receiving an initial state signal. Similarly, slice 2 comprises a function generator implemented as a LUT 230 coupled to a multiplexer 232. The LUT 230 is adapted to receive input signals IN12-IN15, while the multiplexer 232 is coupled to receive the output D4 of the LUT 230 and a registered input value Reg_DI_4. The output of the multiplexer 232 is coupled to a register 234 which generates an output Q4. The write control circuit 228 also generates a partial reset signal and an initial state signal for selectively resetting or setting one or more of the bits of the LUT 230.

Figure 3:
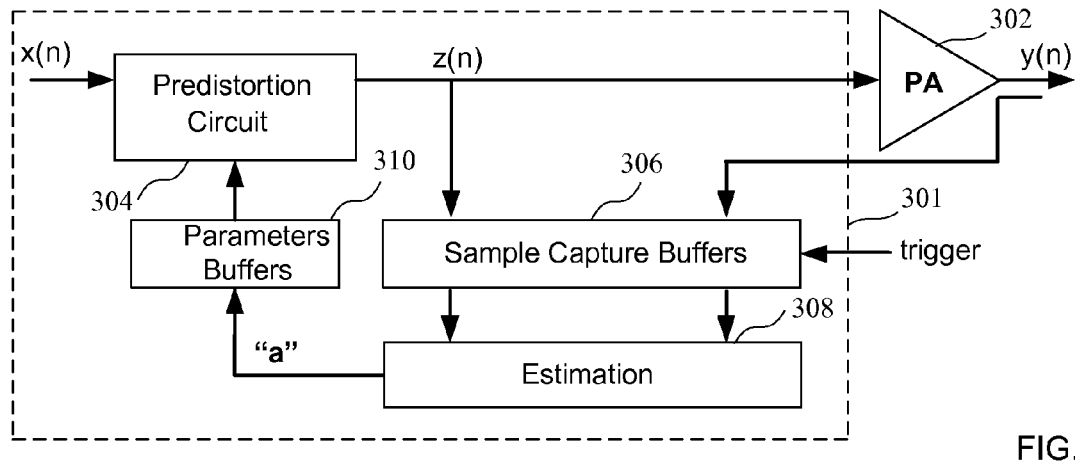
FIG. 3 is a block diagram of an integrated circuit having a circuit for reducing distortion at the output of a power amplifier according to an embodiment of the present invention.

Turning now to FIG. 3, a block diagram of an integrated circuit having a circuit for reducing distortion at the output of a power amplifier according to an embodiment of the present invention is shown. In particular, an integrated circuit 301 is coupled to a power amplifier 302. As will be described in more detail below, analog-to-digital (A/D) and digital-to-analog (D/A) converters may be employed. The integrated circuit comprises a predistortion circuit 304 which is coupled to receive an input signal x(n) and generate an output signal z(n) which comprises a modified version of the input signal and is coupled to the power amplifier. As set forth above, the predistortion circuit modifies the input signal to compensate for distortion in the power amplifier such that the output y(n) of the power amplifier correlates to the input signal. A characterization event for generating parameters to apply to the predistortion circuit begins with a capture of a predetermined number L of samples of data from the input and output of the PA. The samples of the input are taken from the output of the predistortion circuit. Accordingly, the output of the predistortion circuit and the output of the power amplifier are coupled to sample capture buffers 306.

Digital predistortion (DPD) involves performing the operations on a digital signal prior to digital-to-analog conversion. The samples from the output of the PA are typically obtained via some analog circuitry followed by an analog-to-digital converter, as will be described in more detail in reference to FIG. 5. As will further be described in more detail below, a trigger provided to the sample capture buffers enables the storing of the outputs of the predistortion circuit and the power amplifier based upon a detected power value for the input signal. The values stored in the sample capture buffers are provided to an estimation circuit 308. The estimation circuit will generate parameters "a" which will be applied to the predistortion circuit. The parameters may be coefficients of a transfer function, for example, which modify the input signal so that the output of the predistortion circuit offsets the distortion of the power amplifier. The new parameters "a" are stored in a parameters buffer 310 for use by the predistortion circuit. There are number of possible numerical techniques for generating the parameters. Discrete characterization events, where the coefficients are found that best match the PA during some period of L samples duration, may be employed. By way of example, Least Mean Squares estimation over the fixed block of L samples may be used. However, any other method known in the art for generating parameters for a predistortion circuit may be used.

Figure 4:
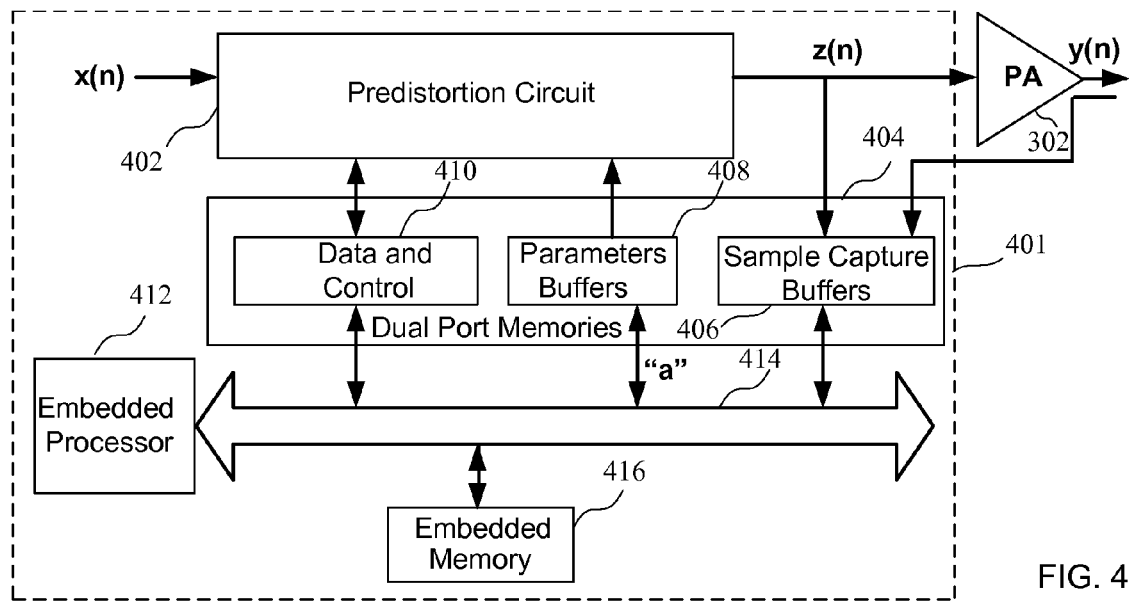
FIG. 4 is a block diagram of an integrated circuit having a circuit for reducing distortion at the output of a power amplifier and an embedded processor according to an embodiment of the present invention.

Turning now to FIG. 4, a block diagram of an integrated circuit having a circuit for reducing distortion at the output of a power amplifier and an embedded processor according to an embodiment of the present invention is shown. The integrated circuit 401 of FIG. 4 may be partitioned into components that process a real-time digitally sampled signal and components that relate to calculating the parameters "a" which may comprise estimation coefficients, for example. The real-time components of FIG. 4 may comprise the predistortion circuit 402 and memory elements 404, but may also include circuits for controlling these components, such as circuits applying a trigger signal to the sample capture buffers. The memory elements 404 may comprise sample capture buffers 406, parameter buffers 408, and data and control buffers 410. Communications between the real-time components are preferably made via dual-port random access memories (DPRAMs), which allow independent access to the memory contents from two sets of inputs and outputs. An embedded processor 412 may be used to provide the estimation function and generate the parameters for the predistortion circuit, which may be provided to the parameter buffers 408 by a bus 414. The main working memory for the processor preferably comprises a dedicated embedded memory 416, as shown, and all the data that is manipulated by the embedded processor may pass through the bus. As will be described in more detail below, multiple buses may be employed, depending upon the data stored in the various memories.

The predistortion circuit 402 may be implemented in configurable logic, such as configurable logic blocks of the circuit of FIG. 1. Similarly, the dual port memories may be implemented as dual port random access memories, and may be implemented in the BRAMs of FIG. 1. Finally, the embedded processor 412 may be the processor 110 of FIG. 1, where the estimation circuit may be implemented in software running on the embedded processor. The embedded processor may be constructed from available hardware resources, or may be implemented as a hardware primitive. By way of example, the embedded processor may be a hardwired processor, such as a PowerPC processor, or may be a processor implemented in configurable logic, such as a Microblaze processor, both of which are available from Xilinx, Inc. of San Jose, Calif. and implemented in Xilinx programmable logic devices.

An estimation sequence executed by the embedded processor will begin by reading and writing the Data and Control DPRAM to establish the trigger for the data capture, with possible conditioning based of the state of the transmitted data. For example, it would be unwise to attempt to generate estimation parameters during a time when there is no data being transmitted. After the L samples are captured in the capture buffers, these samples may then be processed by the estimation software running on the embedded processor to produce the parameters, which are then written into the parameters buffers. After the sample captures are processed, the sample capture buffers are available to the integrated circuit, and particularly the embedded processor for use as further working memory. This availability of memory after generating the parameters helps with overall hardware efficiency. In a practical system, other functions such as measurements of the transmitted signal may also be used by the estimation circuit, as will be described in more detail below in reference to FIG. 6. These real-time functions are included in the predistortion circuit, and the data and control memories are provided for the estimation circuit to enable these functions.

Figure 5:
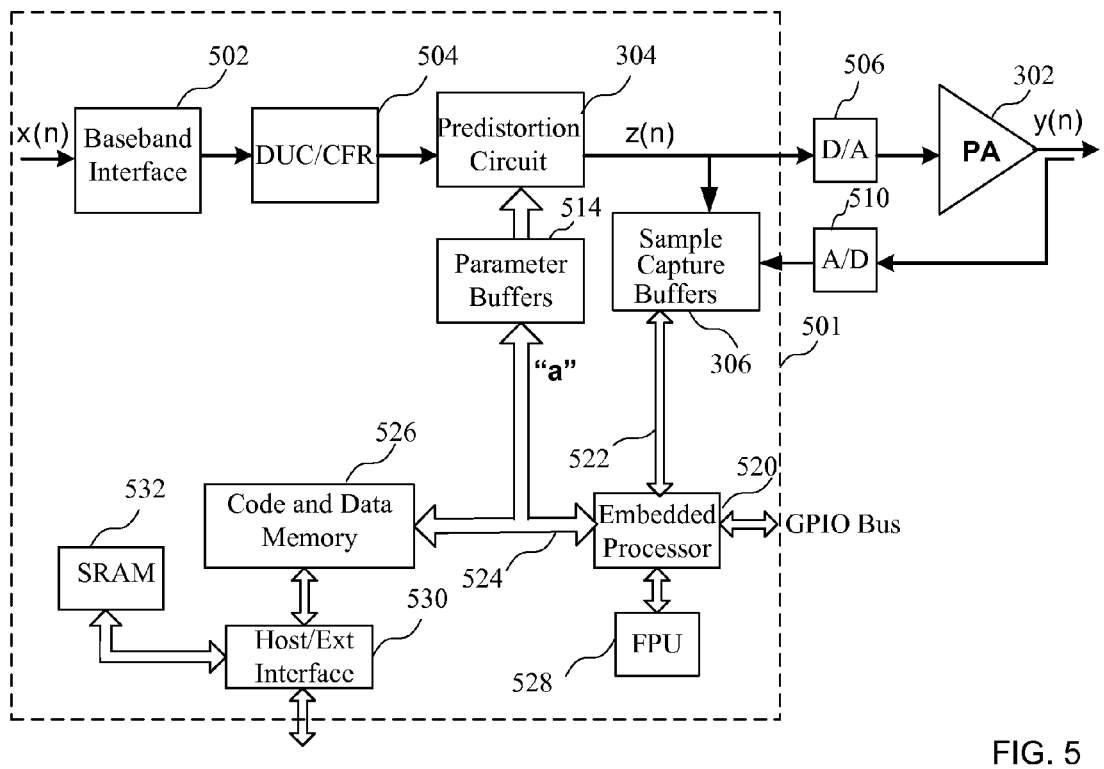
FIG. 5 is a block diagram of an integrated circuit having a circuit for reducing distortion at the output of a power amplifier and an embedded processor according to an alternate embodiment of the present invention.

Turning now to FIG. 5, a block diagram of an integrated circuit having a circuit for reducing distortion at the output of a power amplifier and an embedded processor according to an alternate embodiment of the present invention is shown. In particular, the integrated circuit 501 comprises a baseband interface 502 coupled to receive an input signal, the output of which is coupled to a DUC/CFR circuit 504. The DUC/CFR circuit 504 provides digital up conversion and crest factor reduction. Digital up conversion converts the input signal to the appropriate digital format, while crest factor reduction helps to reduce the peak-to-peak average power ratio, as is well known in the art. The output of the DUC/CFR circuit 504 is applied to the predistortion circuit 304, the output of which is coupled to both a digital-to-analog converter 506 and sample capture buffers 306. The sample capture buffers also receive an output from an analog-to-digital converter 510. As will be described in more detail below, an embedded processor 520 controls the sample capture buffers to ensure that the correct parameters are provided to the predistortion circuit. For example, the embedded processor ensures that the received samples are brought into alignment with the transmitted samples with respect to frequency, time and amplitude. In addition to the amplitude of the signals being aligned, any delay between the two signals will be eliminated to ensure that they are aligned in time. That is, because of the time required to pass through the power amplifier will cause the signals to be out of alignment, it is necessary to adjust the alignment of the signals. Finally, the delay aligned signal may be coupled to a frequency offset correction circuit to ensure that the frequencies of the signal are the same. This processing may be a part of the estimation circuit, and more particularly, a set of functions in the software running on the embedded processor. The processing may be done in real time as they are received, or after they are stored.

The embedded processor 520 may be coupled to a plurality of buses. For example, a first bus 522 may be used to transfer data between the sample capture buffers 512 and the embedded processor 520. A separate bus 524 may be used to couple data between the embedded processor and a code and data memory 526. While a single bus may be used, one benefit of using multiple buses is that the data may be transferred at different data rates. For example, the data from a sample capture buffers may take additional clock cycles to be received because they are received from the programmable logic, while the data from the code and data memory 522 may be accessed directly by the embedded processor. Other circuits, such as a floating point unit (FPU) 528, may be coupled to the embedded processor. Similarly, a host/external interface 530 and a separate SRAM 532 may be used to provide data to the code and data memory 526. The code and data memory 526 may contain any necessary computer code or data required to implement the predistortion circuit using the embedded processor.

Figure 6:
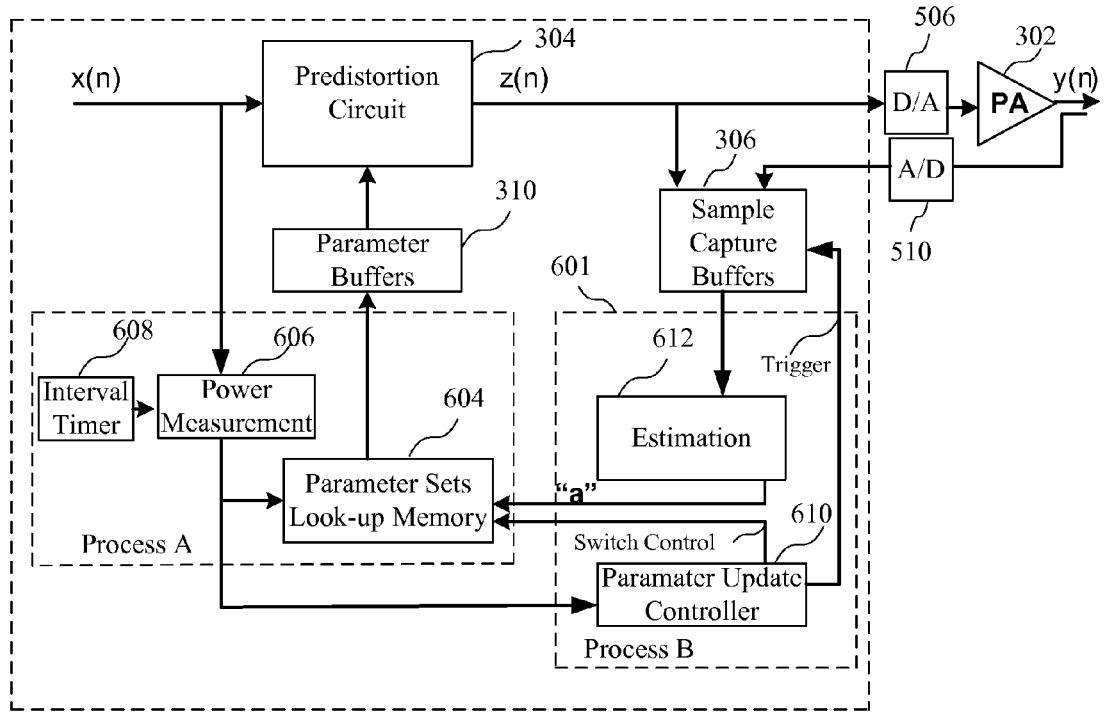
FIG. 6 is a block diagram of an integrated circuit having a circuit for reducing distortion at the output of a power amplifier and circuits for adapting coefficients according to an embodiment of the present invention.

Turning now to FIG. 6, a block diagram of an integrated circuit having circuits for adapting coefficients according to an embodiment of the present invention is shown. One problem faced in implementing a power amplifier in a system is that the average power that is being transmitted may change over time. For example, in a cellular communications system, a variation in average power may result from traffic density or call load. When predistortion parameters are calculated at one average power, the correction of the distortion may not be as beneficial when the transmitted signal changes to a different average power. Particularly, spectral compliance for adjacent channel power may not be achieved at the new power. According to one aspect of the invention, the circuit of FIG. 6 introduces a learning process which tracks the characteristics of the power amplifier, and which operates concurrently with a look-up function that applies different parameters in response to power changes. While the learning process involves the computationally intensive parameter estimation, only the look-up process, which is computationally simple, needs to track the power variations. Thus the computational throughput requirement is reduced, and a more compact integrated digital predistortion arrangement may be achieved.

In particular, the circuit of FIG. 3 has been modified as shown in FIG. 6 to include circuits for implementing a first process, designated as a Process A, for providing a lookup method for parameters which are applied to the predistortion circuit, and a second process, designated as a Process B, for updating the parameters. According to the embodiment of FIG. 6, a parameter sets look-up memory 604 is coupled to receive a power value, such as an average power of the input signal, from a power measurement circuit 606 to determine what values to apply to the predistortion circuit. The power measurement circuit may be controlled by an interval timer 608, for example, which determines the period of operation for Process A. That is, new parameters may be loaded into the parameter buffers on a periodic basis according to an output of the interval timer. The average power may be continuously and repeatedly measured over a time interval that is long enough to be representative of the statistics that determine the spectral character of the signal, such as average power, but short enough to track the call-load. The time interval for determining the average power may be calculated on an order of 10's of milliseconds, for example.

The parameters sets look-up memory contains N parameters sets with information tags, where N is a configuration variable greater than or equal to 1. The information tags may comprise, for example, metrics of the signal, such as an average power or the direction of the power of the signal, metrics of the capture that were used, such as a maximum index or number of peaks, or time, such as interval ticks. In response to the determination of a new power value, which may be generated once per interval, the parameters sets look-up memory updates the parameters in the parameter buffer used by the predistortion circuit. As will be described in more detail below, the parameters sets look-up memory rules may select a parameter set of the plurality of parameter sets according to range criteria. That is, a parameter set may represent a range of power values, and one parameter set may correspond to a given power measurement signal or other metric of the signal The parameter sets may be updated according to the Process B controlled by a parameters update controller 610. In particular, an estimation circuit 612 is coupled to receive the outputs of the sample capture buffers and generate the parameters, as set forth above. The parameters update controller is responsible for triggering the estimation process and overwriting parameter sets and information tags according to its defined rules. The parameters update controller rules are preferably also based on the power measurements. The parameters sets look-up memory and parameters update controller rules are driven by the characteristics of a PA when predistorted (i.e. specifically what happens when the signal power changes after the coefficients are calculated).

While Process B is also repetitive, it does not necessarily have a timer. Its period may be determined by the time taken for estimation, thereby improving hardware efficiency of the circuit. Estimation times of the order of seconds by the parameter updates controller are acceptable because the system is fully adaptive at the Process A interval rate once the parameters sets look-up memory is populated. Where a microprocessor is used for the estimation of parameters, the processes enabling predistortion, other than the power measurement which must involve real-time logic, may be implemented in software. Further, Process A and Process B could be concurrent tasks in a real-time operating system environment. Alternatively, with a single-thread program, Process B may be a loop and Process A may be an interrupt service routine, with the interrupt provided by the interval timer. While the circuits for implementing Process A and Process B have been shown in relation to the circuit of FIG. 3 by way of example, these circuits may also be implemented in the embodiments of FIGS. 4 and 5.

Figure 7:
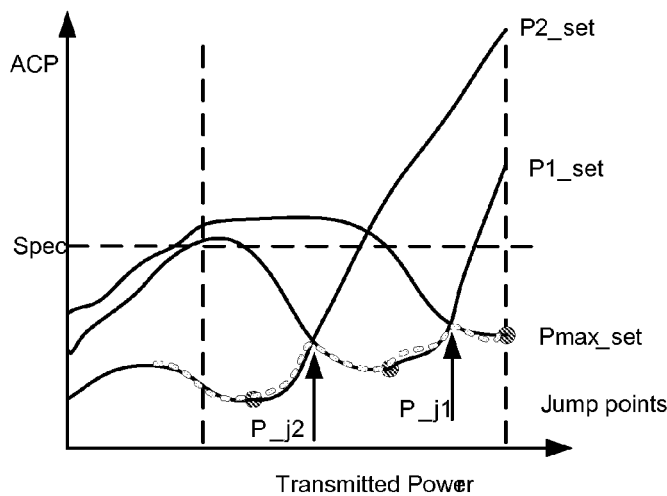
FIG. 7 is a graph showing adjacent channel power as a function of transmitted power for a plurality of parameter sets having coefficients for a predistortion circuit according to an embodiment of the present invention.

Turning now to FIG. 7, a graph shows an example of adjacent channel power as a function of transmitted power for a plurality of parameter sets having coefficients for a predistortion circuit according to an embodiment of the present invention. The characteristics of FIG. 7 show a measure of spectral performance versus output power. A convenient measure of spectral performance is an adjacent channel power (ACP) which is defined for the wireless transmission standard being used. A plot of the characteristics shows ACP versus transmitted power for various powers at which the predistortion parameters were estimated. A line marked "SPEC" is shown to indicate the maximum adjacent channel power to be allowed by a given data transmission specification. As can be seen, at moderate and high powers, the predistortion performance only meets the specification in the vicinity of the power, designated as Pmax, P1 and P2, at which the parameters were estimated. At lower transmission power levels, the predistortion performance is compromised at powers above the power at which the parameters were estimated, but is generally no worse below. It can be seen that if three parameter sets, designated according to the transmitted power Pmax, P1, P2, were to be stored in the parameters sets look-up memory, compliance would be assured if the set that was most appropriate to the transmitted power were to be selected by Process A. By way of example, the parameters sets look-up memory rules select the P2 parameter set for powers below P_j2, the P1 parameter set for powers between P_j2 and P_j1 and the Pmax parameter set for powers above P_j1 as shown by the dotted line. The rules need also to account for an initial period of time before which some or all parameter sets have been obtained. Preferably, an initial parameter set based upon the maximum power value for an input signal could be used.

Ideally, the parameters update controller rules would trigger an estimation function and store the parameters whenever Pmax, P1 and P2 are encountered. While the power is continually varying with some degree of randomness, it is never guaranteed that those powers will be encountered in a reasonable period of time. Accordingly, tolerances or variation values, designated as $\Delta$, are introduced. For example, the Pmax set will be estimated whenever the power is between Pmax–$\Delta$ and Pmax, where $\Delta$ is a configuration variable. A $\Delta$ may be defined separately for each parameter set, such as $\Delta$ max, $\Delta$1 and $\Delta$2 for parameter set Pmax, P1 and P2, respectively. The variation values are used to improve the initial learning performance, and are initially set wide. The variation values may also be dynamically changed depending on the state of the parameters sets look-up memory, such as how many sets have been estimated and at which powers. As time evolves and power measurements closer to PMAX, P1 and P2 are encountered, the tolerances may be reduced to a specified minimum. As will be described in more detail below, the tolerance may be reduced to a minimum value after the detected power falls within a range for one of the parameter sets, and that parameter set is updated. It should be noted that ranges defined by the power values and variation values may overlap, in which case multiple parameter sets may be updated.

The tolerances may also be manipulated to accommodate for variations in radio frequency (RF) and PA gain. Variations in RF portions of the circuit for transmitting the signal to the power amplifier and in the power amplifier itself are generally slow variations. These variations may be related to changes in the thermal environment, and may be on a time-scale of minutes, for example. Because the performance of the predistortion circuit may be sensitive to gain, it is desirable that parameters are re-estimated unconditionally within a given time period. This re-estimation may be achieved by increasing the $\Delta$'s with time at a selected rate. Further, some PA's will have a Pmax characteristic similar to the P2 characteristic. That is, the parameters at Pmax are good for all powers. In such a case, the parameters sets look-up memory may only comprise a single parameter set, and the appropriate parameters update controller rule is to re-estimate the parameters whenever the power is greater than the last power at which estimation was performed. The elements of FIGS. 3-6 may be implemented using the device of FIGS. 1 and 2, where the real-time components may be constructed from the hardware resources available within an FPGA which may include logic cells and dedicated arithmetic and memory blocks, and the remaining components may be implemented using the embedded processor as set forth above.

When determining parameters for a predistortion circuit, a problem occurs when the transmitted signal has a pulsed envelope, which is typical in high-speed data communications. If the data capture is made during the low period of the signal, the predistortion parameters will not be useful during the high periods of the signal because the range of data is insufficient. For good predistortion estimation, the capture needs to occur in the high period of the signal. The success of predistortion estimation is based on spectral emissions improvement. Accordingly, a statistical view of the spectral emissions is preferably used because a measurement interval must be defined for a spectrum. In practice, this may be related to the sweep time of the spectrum analyzer used for standards compliance testing. The estimation is based on discrete characterization events, where the parameters are estimated with a capture of L samples of data from the input and output of the PA. In practice, the period for collecting the L samples will be much shorter that the interval over which the spectral measurements are taken. The success of the estimation will depend on these short duration characterization events being sufficiently accurate for the longer interval. The circuits and methods of the present invention ensure that the L samples are statistically representative of the signal over a longer measurement interval.

Figure 8:
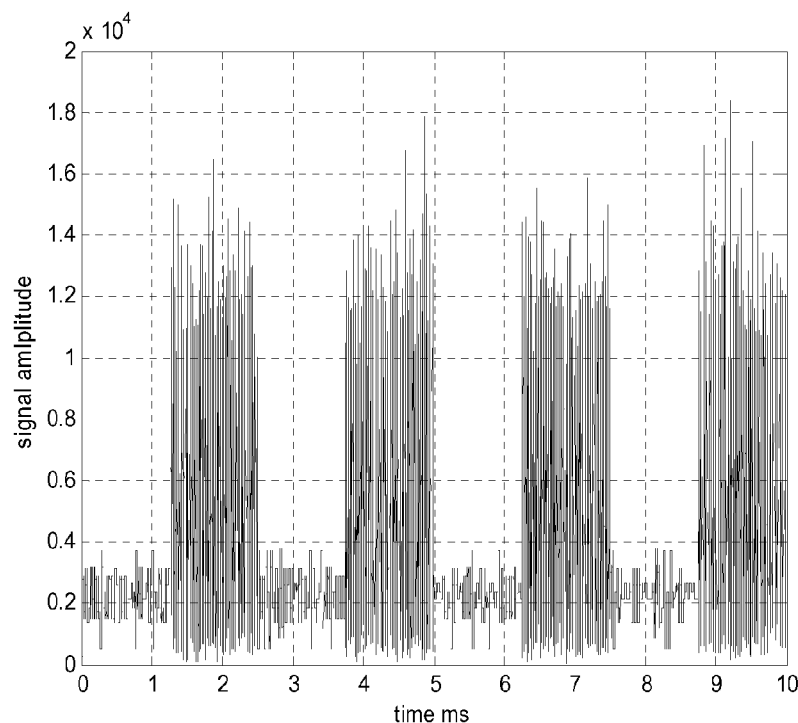
FIG. 8 is a chart showing the capture of input signals over a period of time according to an embodiment of the present invention.

Average power and amplitude histograms are continuously and repeatedly measured over a time interval that is long enough to be representative of the statistics that determine the spectral character of the signal. This interval will need to be of the order of 10's of milliseconds. Typically the minimum spectrum analyzer sweep time may be approximately 100 milliseconds and the maximum length of L samples may be approximately 20 microseconds. As shown in FIG. 8, a graph indicates that the input signals is captured over a period of time known as the Mean Signal Interval, where a typical 10 milliseconds interval is shown. The average power is the accumulation of $|x(n)|^2$ over the Mean Signal Interval. As will be described in more detail below, a histogram is created which comprises an accumulation of the number of occurrences of each of the discrete values of the signal amplitude $|x(n)|$ over the Mean Signal Interval.

Figure 9:
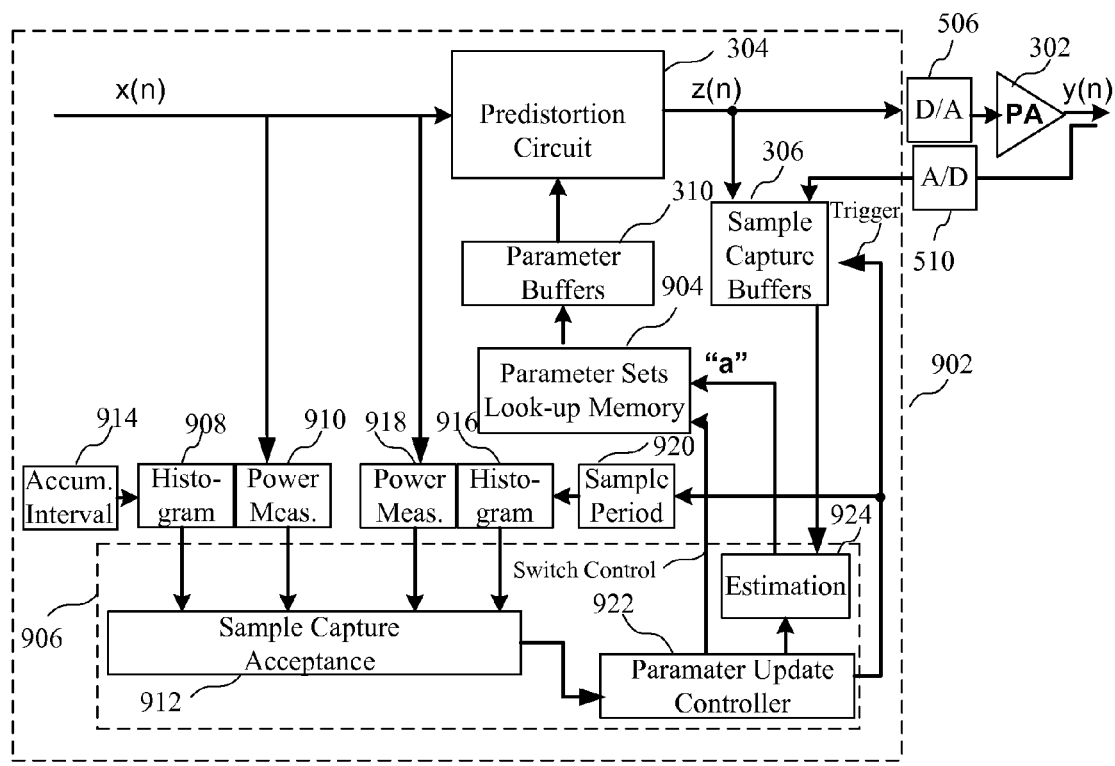
FIG. 9 is a block diagram of a circuit for accepting a sample of an input signal to be used to calculate parameters for a predistortion circuit of an integrated circuit according to an embodiment of the present invention.

Turning now to FIG. 9, a block diagram of a circuit for accepting a sample of an input signal to be used to calculate parameters for a predistortion circuit of an integrated circuit 902 is shown. The circuit of FIG. 3 has been modified to include a parameter sets look-up memory 904 which is coupled to receive updated parameters from a control circuit 906. The control circuit is coupled to receive data related to the information signal. In particular, a histogram 908 is created based upon data from a power measurement circuit 910 over the accumulation interval. The data may be used by a sample capture acceptance circuit 912 based upon a signal from an accumulation interval circuit 914.

Data related to a sample of the input signal may also be stored in a histogram 916 based upon an output of a power measurement circuit 918 in response to a control signal by a sample period circuit 920. As will be described in more detail below, it is the data in the histogram 916 taken over a short period of time that is compared against data in the histogram 908 taken over a long period of time to determine whether the data associated with the sample is acceptable data to be used to generate coefficients for the predistortion circuit. A parameter update controller 922 is coupled to receive the output of the sample capture acceptance circuit 912. The parameter update controller 922 is also coupled to an estimation circuit 924, which generates updated coefficients as described above and stored in the parameter sets look-up memory 904. The control circuit 906 may comprise a microprocessor running software for performing the sample capture acceptance function, which will be described in detail below in reference to FIGS. 18 and 19.

The input signal detected by the power measurement circuit may be represented in 16 bits, so that the amplitude will be a 15 bit number. In order to reduce the storage requirements, the amplitude may be truncated to N bits. By way of example, N=8 may be sufficient, resulting in 256 amplitudes which may be represented. According to one embodiment, the histogram circuit may comprise logic to initialize the RAM at the beginning of each measurement interval and to transfer the content to a buffer at the end of each measurement interval. When a capture of the input signal is triggered, the power and histogram are also computed over the interval of the capture, resulting in L samples. Acceptance criteria are then applied to the captured samples over the capture interval. As will be described in more detail below, the acceptance criteria may be based on a comparison of data derived from the power and histogram measurements over the capture interval with data derived from the power and histogram measurements over the Mean Signal Interval. If the criteria are met as will be described in more detail below, the captured data is used for predistortion parameter estimation. If not, the capture is repeated. An upper limit on attempts to capture an acceptable sample to be used to generate parameters may be set as a system error threshold. That is, if acceptable data for generating predistortion parameters is not received with a predetermined period of time or within a predetermined number of attempts to acquire acceptable data, an error flag may be generated. While the circuit of FIG. 9 show modifications to the circuit of FIG. 3, the circuit may also include elements of the other embodiments set forth above. Although the descriptions of FIGS. 8 and 9 relate to power measurements according to one embodiment, the circuit of FIG. 9 could measure any of the information tags set forth above, or some other metric for the input signal.

Figure 10:
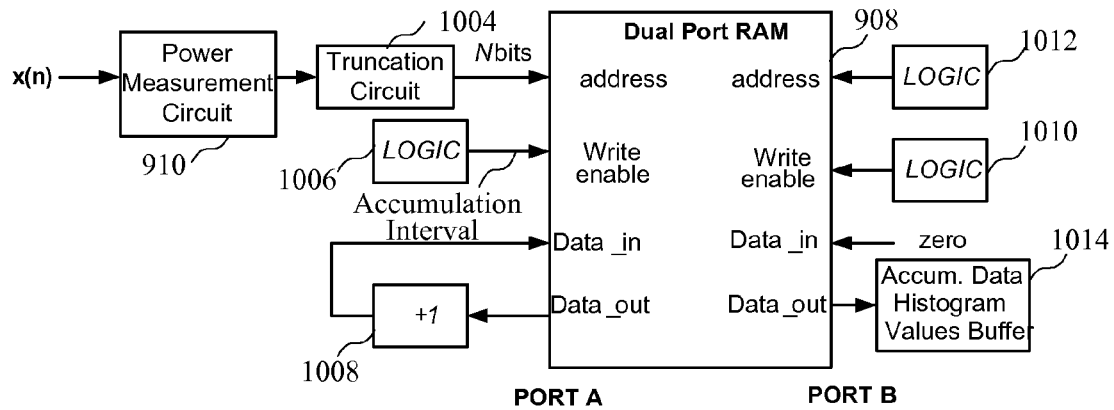
FIG. 10 is a block diagram of a random access memory for storing data related to the input signal over a period of time according to an embodiment of the present invention.

According to one embodiment, each signal amplitude value addresses a storage location of a RAM, and data for that signal amplitude value is incremented every time that amplitude value occurs to create a count for each given signal amplitude value. The RAM preferably comprises a dual port RAM, enabling separately accessing the data using two ports, as will be described in detail. As shown in FIG. 10, the histogram 908 comprises a random access memory for storing data related to the input signal over a period of time. The output of the power measurement circuit 910 may be coupled to a truncation circuit 1004. The truncation circuit is used for truncating the detected power value to reduce the number of storage locations required to store the data. For example, by truncating the signal output by the power measurement circuit to eight bits, only two hundred fifty six storage locations would be required to store a count for each of the two hundred fifty six power levels defined by the eight bits. A logic circuit 1006 provides an active write enable signal to a first port, Port A, for the histogram 908 by generating an active write enable signal associated with the accumulation interval. The data in a given address based upon the power measurement circuit is incremented by an incrementing circuit 1008 at the data output. Accordingly, data stored at a given address will be the previously stored data incremented by 1 whenever data in that address is accessed.

Data may also be read out of the memory and reset as necessary. For example, a logic circuit 1010 is coupled to a write enable input for a second port, Port B, of the RAM. After all of the data has been written to the histogram 908 during the accumulation interval, that data may be read out of the memory based upon an address provided by address logic circuit 1012 and stored in an accumulation data histogram values buffer 1014. That is, the data that is transferred to buffer 1014 may be used by the control circuit 906 to generate parameters for the predistortion circuit, while new data is stored in the histogram 908. The values representing the counts for the histogram may be reset by loading zeroes in the memory. Because the values stored in the memory represent a count, they must be reset. Accordingly, after the complete histogram has been created during an accumulation interval, the values stored in the memory representing the counts for the different power levels are all reset to zero. The address logic circuit 1012 will allow reading the data from the histogram 908 to fill the accumulation data histogram values buffer 1014, or allow resetting all of the memory locations to zero by sequencing through all of the addresses. Accordingly, the logic circuit 1006 will generate a write enable signal to enable generating the count by loading new data into the memory during the accumulation interval, while logic circuit 1010 will generate a write enable signal to enable writing to Port B after the accumulation interval to reset the histogram.

Figure 11:
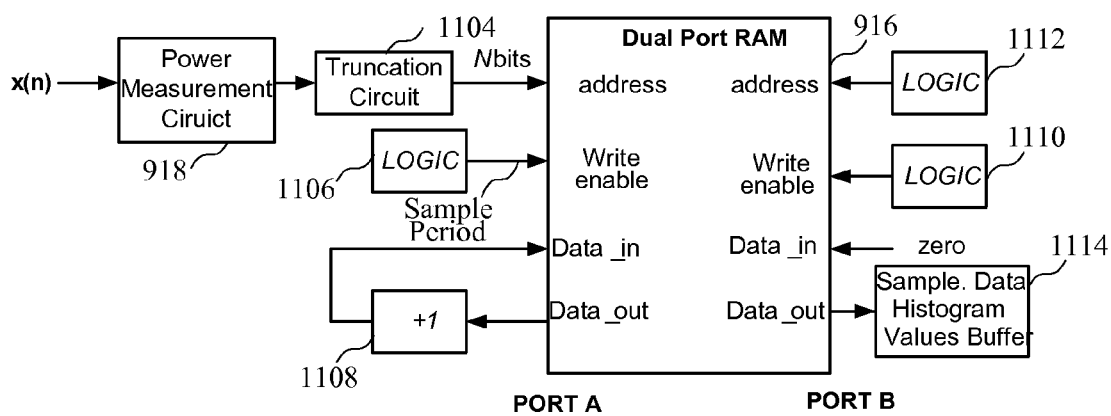
FIG. 11 is a block diagram of a random access memory for storing data related to input signals captured in response a capture trigger signal according to an embodiment of the present invention.

The block diagram of FIG. 11 shows a random access memory for storing data related to signals taken during a sample capture period which operates very similarly, but are based upon signals captured in response a capture trigger signal. In particular, the histogram 916 comprises a random access memory for storing data related to the input signal over the sample period defined by the sample period circuit 920, which may be 10 microseconds, for example. The output of the power measurement circuit 918 may also be coupled to a truncation circuit 1104 to reduce the storage requirements as set forth above. A logic circuit 1106 generates an active write enable signal to a Port A for the histogram 916 by generating an active write enable signal for the sample period to generate L samples. The data in a given address based upon a value determined by the power measurement circuit is incremented by an incrementing circuit 1108 at the data output, as set forth above.

Data may also be read out of the memory and reset as necessary. For example, a logic circuit 1110 is coupled to a write enable input for a Port B of the circuit. After all of the data has been written to the histogram 916 during the sample period, that data may be read out of the memory and stored in an sample data histogram values buffer 1114. The values representing the counts for the histogram 916 may also be reset by loading zeroes in the memory. That is, after the values for histogram 916 have been created during the sample period and stored in the sample data histogram values buffer 1114, the values stored in the memory representing the counts for the different power levels of the L samples are also all reset to zero. The logic circuit 1112 will allow reading the data from the histogram 916 to fill the sample data histogram values buffer 1114, or providing the addresses for resetting all of the memory locations to zero. The values stored in the sample data histogram values buffer 1114 and the values stored in the accumulation data histogram values buffer 1014 may then be used by the control circuit 906 to determine whether an input signal is acceptable for generating coefficients for the predistortion circuit.

Figure 12:
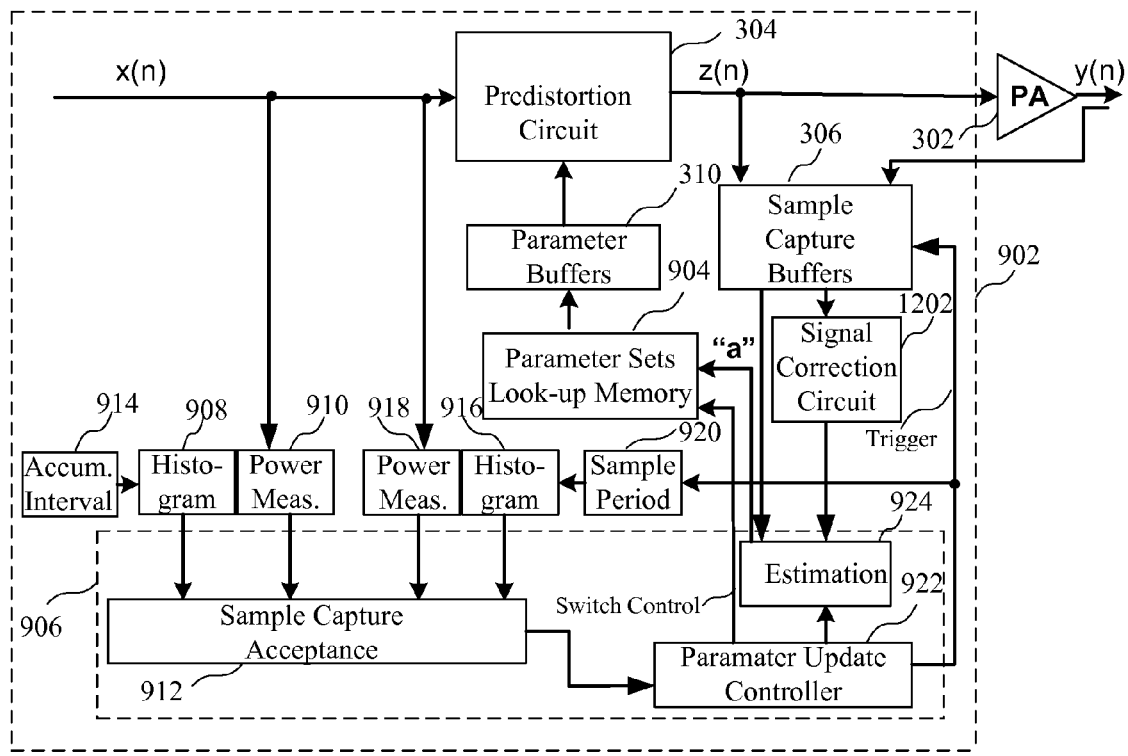
FIG. 12 is a block diagram of a circuit for generating parameters for a predistortion circuit according to an embodiment of the present invention.

Turning now to FIG. 12, a block diagram of a circuit for generating parameters for a predistortion circuit according to an embodiment of the present invention is shown. In particular, the circuit of FIG. 9 has been amended to include a signal correction circuit 1202. As will be described in more detail below, signals coupled to the sample capture buffers will be adjusted to have the same amplitude and be aligned in time and frequency. In order for an estimation of parameters for a predistortion circuit to be successful, the amplitude of captured signal samples must be the same and the signals aligned before parameter estimation is performed with the data. According to one aspect of the invention, frequency offset correction is provided to the processing chain prior to estimation. Frequency offset correction will improve the quality of the estimation, which may lead to improved spectral correction.

Figure 13:
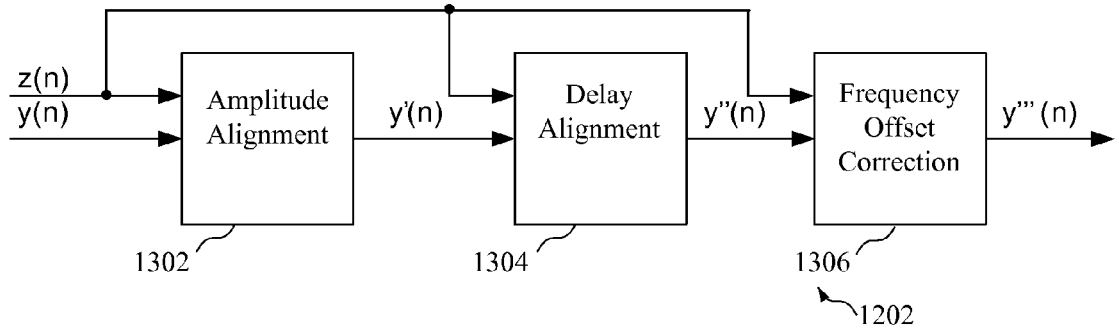
FIG. 13 is a block diagram of the signal correction circuit 1202 of FIG. 12 according to an embodiment of the present invention.

As shown in the block diagram of FIG. 13, the signal correction circuit 1202 of FIG. 12 comprises an amplitude alignment circuit 1302 coupled to receive both the output of the predistortion circuit $z(n)$ and the output of the power amplifier $y(n)$. The output of the amplitude alignment circuit comprises an amplitude adjusted output $y'(n)$ of power amplifier which is coupled to a delay alignment circuit 1304. The delay alignment circuit will eliminate any delay between the two signals to ensure that they are aligned in time. That is, because of the time required to pass through the power amplifier will cause the signals to be out of alignment, it is necessary to adjust the alignment of the signals. Finally, the delay aligned signal $y''(n)$ output by the delay alignment circuit 1304 will be coupled to a frequency offset correction circuit 1306. Details for the various modifications will be described in more detail below. In particular, amplitude alignment will be described in more detail in reference to FIG. 14, delay alignment will be described in more detail in reference to FIGS. 15 and 16, and frequency offset control will be described in more detail in reference to FIG. 17.

Figure 14:
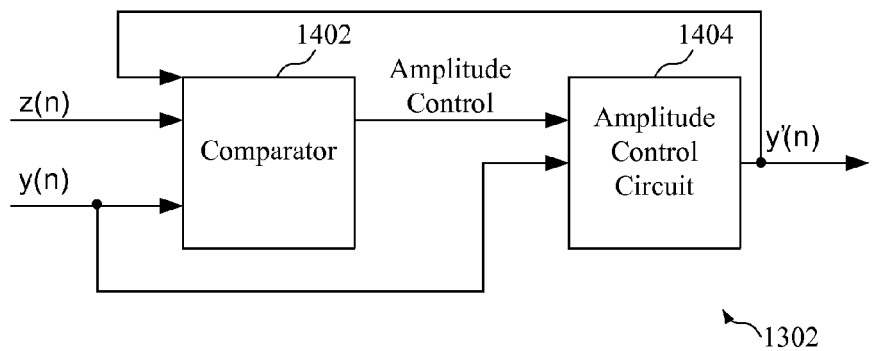
FIG. 14 is a block diagram of the amplitude alignment circuit 1302 of FIG. 13 according to an embodiment of the present invention.

Turning now to FIG. 14, a block diagram of the amplitude alignment circuit 1302 of FIG. 13 according to an embodiment of the present invention is shown. A comparator 1402 is coupled to receive the output of the predistortion circuit and the output of the power amplifier, and to generate an amplitude control signal based upon a comparison of the two signals. For example, the amplitude control signal may comprise both a magnitude and a direction. Assuming that the output of the power amplifier $y(n)$ is to be adjusted in amplitude, if the amplitude of $y(n)$ is greater than $z(n)$, the magnitude of $y(n)$ is reduced by a predetermined magnitude determined by the comparator. The output $y'(n)$ of the amplitude control circuit 1404 may be continuously fed back to the comparator to provide a feedback loop to ensure that the amplitude is maintained.

Figure 15:
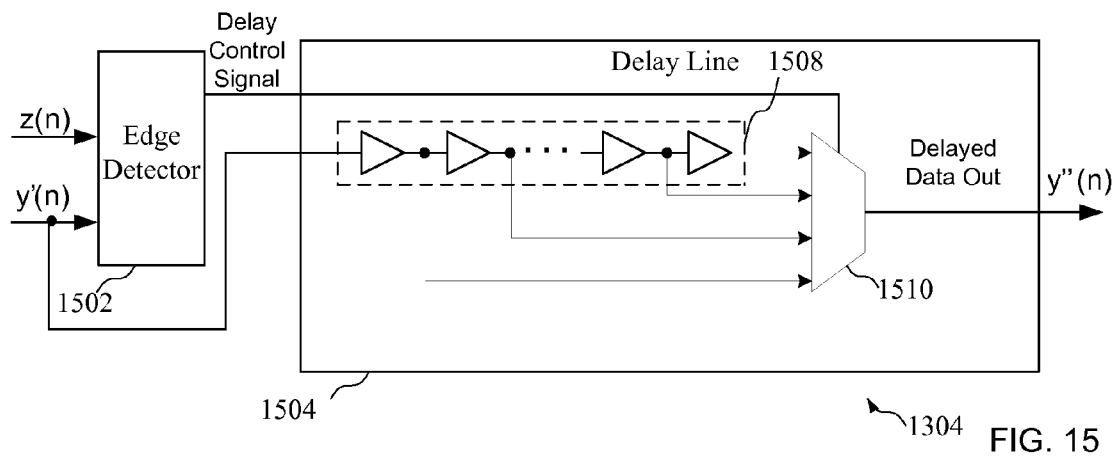
FIG. 15 is a block diagram of the delay alignment circuit 1304 of FIG. 13 according to an embodiment of the present invention.

Turning now to FIG. 15, a block diagram of the delay alignment circuit 1304 of FIG. 3 according to an embodiment of the present invention is shown. In particular, an edge detector 1502 is provided to generate a delay control signal to control a delay circuit 1504. The input signal $y'(n)$ is coupled to a plurality of delay elements 1508. A multiplexer 1510 is coupled to select the output after a desired number of delay elements of the plurality of delay elements 1508 based upon a delay control signal as shown. The plurality of delay elements 1508 may be a 64 tap delay line, for example. The delay elements of FIG. 15 may be implemented in I/O blocks of the PLD described above with respect to FIG. 1. While the delay element of FIG. 15 is shown by way of example, other delay elements or configurations may be implemented.

Figure 16:
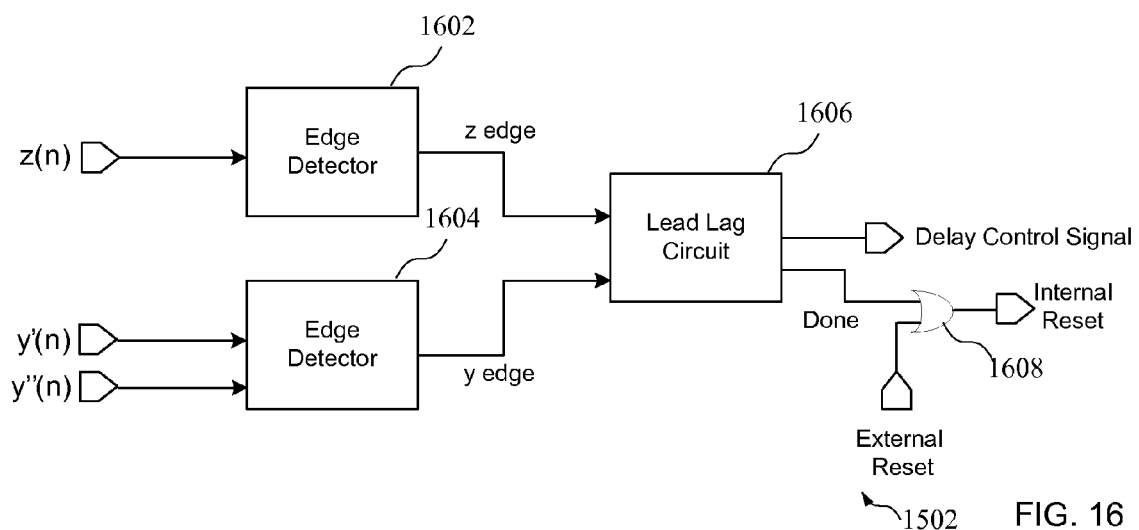
FIG. 16 is a block diagram of the edge detection circuit 1502 of FIG. 15 according to an embodiment of the present invention.

Turning now to FIG. 16, a block diagram of the edge detection circuit 1502 of FIG. 15 according to an embodiment of the present invention is shown. The edge detector of FIG. 16 comprises a level mode phase detector that generates a binary output signal identifying the direction the signal $y'(n)$ has to change to be aligned with $z(n)$. An initial delay control signal will be based upon the $y'(n)$ signal, and additional corrections will be based upon the $y''(n)$ signal which is continuously provided to the edge detector 1502. As shown in FIG. 16, the edge detector 1502 includes edge detector 1602 coupled to receive z(n) and an edge detector 1604 coupled to receive y'(n) and y"(n), the output of each of which is coupled to a lead-lag state machine 1606. Edge detector 1502 generates a delay control signal. When the y'(n) signal is leading the z(n) signal, a delay control signal is generated to provide additional delay to the y'(n) signal. Conversely, when y'(n) signal is lagging the z(n) signal, a delay control signal is generated to reduce the delay. While the circuits of FIGS. 13-16 are shown by way of example, other circuits or methods could be employed to adjust the amplitude and eliminate any delay between the output of the predistortion circuit and the output of the power amplifier.

Figure 17:
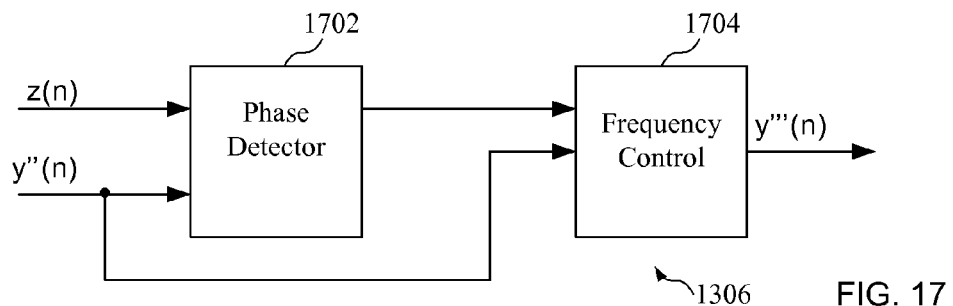
FIG. 17 is a block diagram of the frequency offset correction circuit 1306 of FIG. 13 according to an embodiment of the present invention.

Turning now to FIG. 17, a block diagram of the frequency offset correction circuit 1306 of FIG. 13 according to an embodiment of the present invention is shown. When mixing the PA output signal down to the required baseband frequency to be compared with the output of the predistortion circuit, some error in frequency may be introduced. While the accuracy of the conversion may be very good (e.g. within parts-per-million), the residual error may still affect predistortion performance. Accordingly, frequency offset correction is performed, resulting in an improvement in the predistortion performance.

While the frequency offset may be corrected in a number of ways, the frequency offset may corrected according to the present invention using various approximations to simplify the calculation of a required frequency. According to one embodiment, frequency offset correction is performed by adjusting the phase of the received samples linearly in proportion with time, where the slope represents the frequency. The slope can be estimated by standard linear regression of the phase difference between the transmitted and received samples. Because the frequency offset is small, the computation can be simplified. More particularly, with $x(n)=|x(n)|e^{j\Phi(n)}$ and $y(n)=|z(n)|e^{j\Phi(n)}$, the simplified frequency offset correction to y(n) involves multiplication by a vector "a+bn", where a and b are the linear regression coefficients that fit the data $\Delta(n)=e^{j\Theta(n)-\Phi(n)}=(x(n)/|x(n)|/(y(n)/|y(n)|)$.

The signals may be represented as complex numbers, where z(n)=a(n)+jb(n) and y(n)=c(n)+jd(n). Because the phase angle of the signals is represented by $z(n)=|z(n)|\cdot e^{j\Theta(n)}$ and $y(n)=|y(n)|\cdot e^{j\Phi(n)}$, $$\check{z}(n) = e^{j\Theta(n)} = \frac{z(n)}{|z(n)|} = \frac{a(n)}{\sqrt{(a^2)+(b^2)}} + j\frac{b(n)}{\sqrt{(a^2)+(b^2)}}, \text{ and}$$

$$\hat{y}(n) = e^{j\Phi(n)} = \frac{y(n)}{|y(n)|} = \frac{c(n)}{\sqrt{(c^2)+(d^2)}} + j\frac{d(n)}{\sqrt{(c^2)+(d^2)}}$$

In order to correct y(n) to be frequency aligned with z(n), y(n) is multiplied by Δ(n), such that y(n)·Δ(n)=z(n). In order to simplify the calculation, the Δ(n) is approximated as a linear equation representing ž(n)/ŷ(n). Accordingly, Δ(n) may be represented as a linear equation A+nB corresponding to ž(n)/ŷ(n), where A comprises an offset and B comprises a slope. That is, because the angle representing the phase difference should be small, $\Delta(n)=e^{j\Theta(n)-\Phi(n)}$ may be represented by an approximation of ž(n)/ŷ(n). Because this involves only a complex magnitude calculation and simple arithmetic, the computation involving trigonometric functions is avoided.

Figure 18:
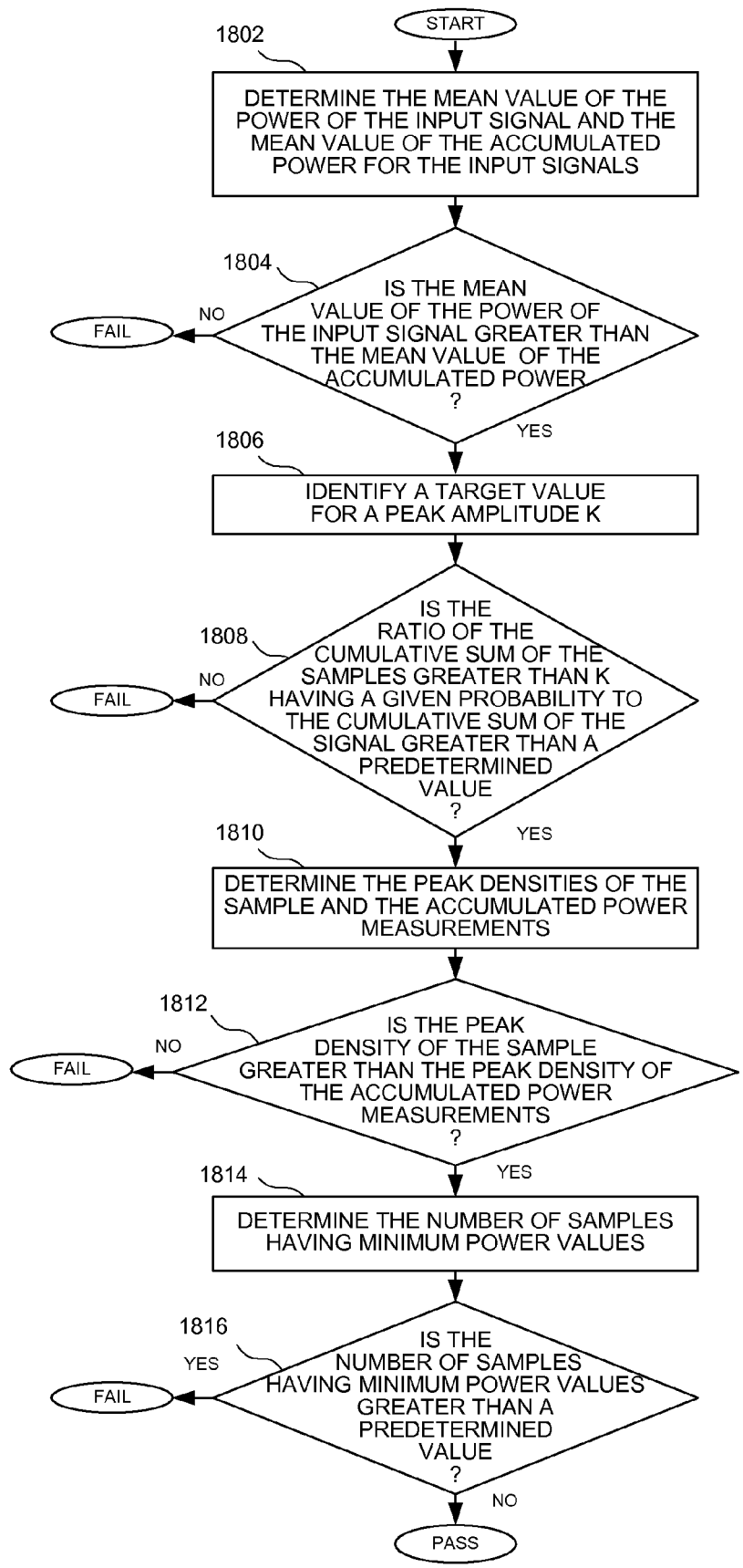
FIG. 18 is a flow chart showing criteria for selecting a sample of an input signal to calculate parameters for a predistortion circuit according to an embodiment of the present invention.

Turning now to FIG. 18, a flow chart shows criteria for determining whether a sample of an input signal is acceptable to calculate parameters for a predistortion circuit according to an embodiment of the present invention. The criteria may include, but need not be limited to, a mean power test, a peak amplitude test, a peak density test, and a low power test. The mean power test is used to verify that the mean power of the captured samples is greater than the mean power of the input signal over the Mean Signal Interval, within some tolerance. Accordingly, the mean value of the power of the input signal detected during the sample period and the mean value of the accumulated power for the input signals over the accumulation interval are determined at a step 1802. It is then determined whether the mean value of the sampled signal of the input signal is greater than the mean value of the accumulated power taken over the accumulation period at a step 1804. If the mean value of the sampled signal is not greater than the mean value of the accumulated power, then the test fails. The mean value of the sampled signal may have to exceed the mean value of the accumulated power by a predetermined amount.

In the peak amplitude test, the ratio of the sum of the captured samples occurring with at least a given probability to the sum of the full signal measured over the accumulation interval should be greater than a predetermined value. That is, not only must the value of a given sample to be used in the peak amplitude test be greater than a predetermined value, but the value of a given sample must have occurred a certain number of times. For example, if one hundred samples are taken during the capture sample period, a minimum number of samples having a given amplitude may be required for those samples to be used in the peak amplitude test. The Mean Signal Interval histogram is used to find a target value for the peak amplitude k of the capture. By way of example, if Y is the cumulative sum of all histogram values of the captured sample with index>k, then k is the value for which ratio of Y to the cumulative sum of the signal over the accumulation interval is p. For p=0, this comparison reduces to a simple comparison of peak values. The algorithm with non-zero p is designed to prevent statistically insignificant individual peaks preventing acceptance. Accordingly, a target value for a peak amplitude k is identified at a step 1806. It is then determined whether the ratio of the cumulative sum of the samples greater than k and having a given probability to the cumulative sum of the input signal over the accumulation interval is greater than a predetermined value at a step 1808.

In the peak density test, the fraction of samples in the capture relative to a defined amplitude threshold level should be greater than the fraction of samples of the full signal relative to the defined amplitude threshold level. The histograms are used to count the number of samples greater than the threshold. Accordingly, the peak densities of the sample and the accumulated power measurements are determined at a step 1810. It is then determined whether the fraction of the peak density of the sample is greater than the fraction of the peak density of the accumulated power measurements at a step 1812.

Finally, a test is performed to determine whether a predetermined number of the L sample signals are below a predetermined threshold, which would indicate that the signal is not acceptable. That is, even if the signal may otherwise meet the criteria of the three previous tests, the signal is still tested to determine whether a sufficient number of the L sample values are low signals (i.e. a minimum power value of either zero or below a predetermined threshold). Accordingly, the number of samples of the captured samples having minimum power values is determined at a step 1814. It is then determined whether the number of samples having minimum power values has exceeded a predetermined value at a step 1816. Although the flow chart of FIG. 18 indicates a failure during the determination of an adequate sample for generating parameters if any one of the tests fails, the method could indicate a failure if a certain percentage of tests fail or if a certain combination of tests fail. While the criteria of FIG. 18 are shown by way of example, other tests could be used.

Figure 19:
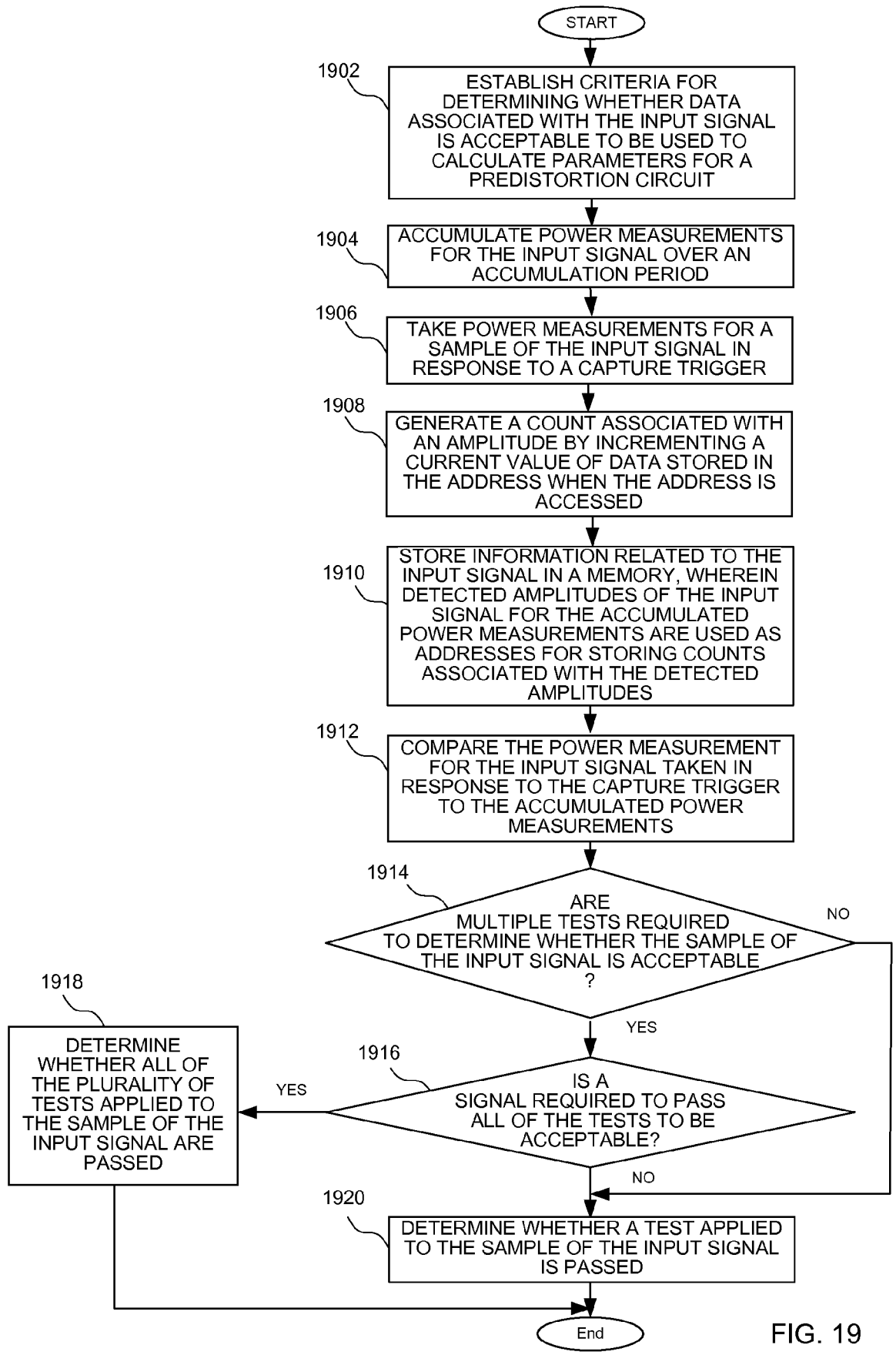
FIG. 19 is a flow chart showing a method of determining whether a sample of an input signal is acceptable to be used to calculate parameters for a predistortion circuit according to an embodiment the present invention.

Turning now to FIG. 19, a flow chart shows a method of determining whether a sample of an input signal is acceptable to be used to calculate parameters for a predistortion circuit according to an embodiment the present invention. Criteria for determining whether data associated with the input signal is acceptable to be used to calculate parameters for a predistortion circuit are established at a step 1902. The criteria could be those set forth above in FIG. 18, or other suitable criteria. Power measurements for the input signal are accumulated over an accumulation period at a step 1904. Power measurements for a sample of the input signal are taken in response to a capture trigger at a step 1906. A count associated with amplitudes is generated by incrementing a current value of data stored in the address when the address is accessed at a step 1908. Information related to the input signal is stored in a memory, wherein detected amplitudes of the input signal for the accumulated power measurements are used as addresses for storing counts associated with the detected amplitudes at a step 1910. The power measurements for the input signal taken in response to the capture trigger are compared to the accumulated power measurements at a step 1912. It is then determined whether multiple tests established to determine whether the sample of the input signal is acceptable to be used to calculate parameters for a predistortion circuit are required at a step 1914. If so, it is also determined whether the signal is required to pass all of the tests to be acceptable at a step 1916. If so, it is then determined whether all of the plurality of tests applied to the sample of the input signal are passed at a step 1918. Otherwise, it is determined whether any required test applied to the sample of the input signal is passed at a step 1920.

Figure 20:
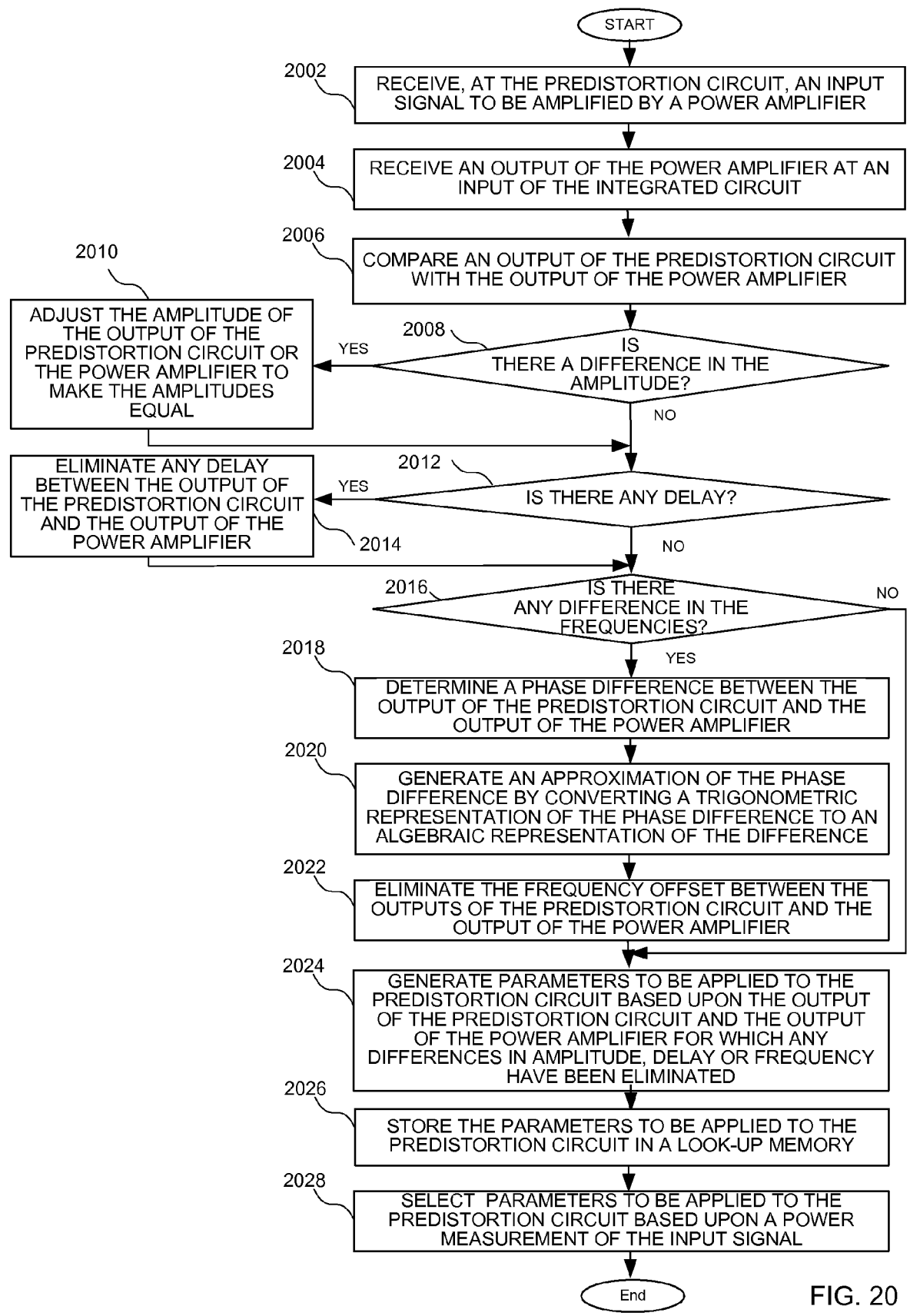
FIG. 20 is a flow chart showing a method of generating parameters for a predistortion circuit according to an embodiment the present invention.

Finally, turning now to FIG. 20, a flow chart shows a method of generating parameters for a predistortion circuit according to an embodiment the present invention. In particular, an input signal to be amplified by a power amplifier is received at the predistortion circuit at a step 2002. An output of the power amplifier is received at an input of the integrated circuit at a step 2004. An output of the predistortion circuit is compared with the output of the power amplifier at a step 2006. It is then determined whether there is a difference between the amplitude of the output of the predistortion circuit and the output of the power amplifier at a step 2008. If so, the amplitude of the output of the predistortion circuit or the output of the power amplifier is adjusted to make the amplitude of the predistortion circuit and the output of the power amplifier equal at a step 2010. It is then determined whether there is any delay between the output of the predistortion circuit and the output of the power amplifier at a step 2012. If so, any delay between the output of the predistortion circuit and the output of the power amplifier is eliminated at a step 2014. It is also determined whether there is any difference in the frequencies of the output of the predistortion circuit with the output of the power amplifier at a step 2016. If so, a phase difference between the output of the predistortion circuit and the output of the power amplifier is determined at a step 2018. An approximation of the phase difference is then generated by converting a trigonometric representation of the phase difference to an algebraic representation of the phase difference at a step 2020, and the frequency offset between the outputs of the predistortion circuit and the output of the power amplifier is eliminated at a step 2022. The parameters to be applied to the predistortion circuit are generated based upon the output of the predistortion circuit and the output of the power amplifier for which any differences in amplitude, delay or frequency have been eliminated at a step 2024. The parameters to be applied to the predistortion circuit in a look-up memory are stored at a step 2026. Parameters to be applied to the predistortion circuit are selected based upon a power measurement of the input signal at a step 2028. The method of FIG. 20 may be implemented using any of the circuits as shown and described above, or using other suitable circuits. While adjustments as shown are made to the output of the power amplifier, the adjustments could be made to the output of the predistortion circuit to conform the two signals.

It can therefore be appreciated that the new and novel circuit for and method of reducing distortion at the output of a power amplifier has been described. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A method of generating parameters for a predistortion circuit in an integrated circuit, the method comprising:
receiving, at the predistortion circuit, an input signal to be amplified by a power amplifier;
receiving an output of the power amplifier at an input of the integrated circuit;
comparing an output of the predistortion circuit with the output of the power amplifier;
conforming the output of the power amplifier with the output of the predistortion circuit; and
generating parameters to be applied to the predistortion circuit based upon the conformed outputs of the power amplifier and the predistortion circuit;
wherein conforming the output of the power amplifier with the output of the predistortion circuit comprises eliminating a frequency offset between the output of the predistortion circuit and the output of the power amplifier by determining a phase difference between the output of the predistortion circuit and the output of the power amplifier and generating an approximation of the phase difference, the approximation of the phase difference being generated by converting a trigonometric representation of the phase difference to an algebraic representation of the phase difference.

2. The method of claim 1 wherein conforming the output of the power amplifier with the output of the predistortion circuit comprises adjusting the amplitude of the input signal received at the predistortion circuit or the output of the power amplifier to make the amplitude of the output of the predistortion circuit and the output of the power amplifier equal.

3. The method of claim 1 wherein conforming the output of the power amplifier with the output of the predistortion circuit comprises eliminating any delay between the output of the predistortion circuit and the output of the power amplifier.

4. The method of claim 1 wherein conforming the output of the predistortion circuit with the output of the power amplifier comprises modifying the output of the power amplifier.

5. A method of generating parameters for a predistortion circuit in an integrated circuit, the method comprising:
receiving, at the predistortion circuit, an input signal to be amplified by a power amplifier;
receiving an output of the power amplifier at an input of the integrated circuit;
comparing an output of the predistortion circuit with the output of the power amplifier;

determining a phase difference between the output of the predistortion circuit and the output of the power amplifier;

generating an approximation of the phase difference;

conforming the output of the power amplifier with the output of the predistortion circuit based upon the approximation of the phase difference by providing delay alignment between the output of the predistortion circuit and the output of the power amplifier, wherein providing delay alignment comprises comparing an edge of the output of the predistortion circuit to an edge of the output of the power amplifier; and generating parameters to be applied to the predistortion circuit based upon conformed outputs of the power amplifier and the predistortion circuit.

6. The method of claim 5 wherein conforming the output of the power amplifier with the output of the predistortion circuit comprises modifying the amplitude of the output of the power amplifier.

7. The method of claim 5 further comprising selecting a delay of a delay circuit in response to the comparison of the edge of the output of the predistortion circuit with the edge of the output of the power amplifier.

8. The method of claim 5 further comprising storing the parameters to be applied to the predistortion circuit in a look-up memory.

9. The method of claim 8 further comprising selecting a parameter set to be applied to the predistortion circuit based upon a power measurement of the input signal.

10. An integrated circuit having a circuit for generating parameters for a predistortion circuit of the integrated circuit, the circuit for generating parameters comprising:

a predistortion circuit coupled to receive an input signal to be amplified by a power amplifier coupled to the integrated circuit;

a signal correction circuit comprising an amplitude alignment circuit coupled to receive an output of the predistortion circuit and an output of the power amplifier, the signal correction circuit conforming the output of the power amplifier with the output of the predistortion circuit; and an estimation circuit coupled to receive the output of the signal correction circuit, the estimation circuit generating parameters for the predistortion circuit based upon the conformed outputs of the power amplifier and the predistortion circuit.

11. The integrated circuit of claim 10 wherein the signal correction circuit comprises a delay alignment circuit.

12. The integrated circuit of claim 10 wherein the signal correction circuit comprises frequency offset correction circuit.

13. The integrated circuit of claim 12 wherein the frequency offset correction circuit determines a trigonometric representation of a phase difference between the input signal received at the predistortion circuit and the output of the power amplifier and generates an approximation comprising an algebraic representation of the phase difference.

14. The circuit for generating parameters of claim 13 wherein the frequency correction circuit comprises processor of a programmable logic device.

* * * * *